US009606179B1

(12) United States Patent
Cunningham et al.

(10) Patent No.: US 9,606,179 B1
(45) Date of Patent: Mar. 28, 2017

(54) METHOD AND SYSTEM FOR IMPROVING EFFICIENCY OF XOR-BASED TEST COMPRESSION USING AN EMBEDDED SERIALIZER-DESERIALIZER

(71) Applicant: Cadence Design Systems, Inc., San Jose, CA (US)

(72) Inventors: Paul Alexander Cunningham, Mountain View, CA (US); Steev Wilcox, San Jose, CA (US); Vivek Chickermane, Slaterville Springs, NY (US); Krishna Vijaya Chakravadhanula, Vestal, NY (US); Brian Edward Foutz, Charlottesville, VA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/754,351

(22) Filed: Jun. 29, 2015

(51) Int. Cl.
*G01R 31/3181* (2006.01)
*G01R 31/3183* (2006.01)
*G01R 31/3185* (2006.01)
*G01R 31/319* (2006.01)
*G01R 31/3177* (2006.01)

(52) U.S. Cl.
CPC ........... *G01R 31/318544* (2013.01); *G01R 31/31813* (2013.01); *G01R 31/31921* (2013.01); *G01R 31/318335* (2013.01); *G01R 31/318547* (2013.01); *G01R 31/3177* (2013.01); *G01R 31/318536* (2013.01); *G01R 31/318558* (2013.01)

(58) Field of Classification Search
CPC .... G01R 31/318547; G01R 31/318335; G01R 31/31921; G01R 31/31813; G01R 31/318544
USPC .................................................. 714/738, 728
See application file for complete search history.

(56) References Cited

U.S. PATENT DOCUMENTS

| | | | | |
|---|---|---|---|---|
| 7,610,540 B2 * | 10/2009 | Balakrishnan ... | G01R 31/31921 703/13 |
| 7,647,540 B2 * | 1/2010 | Rajski ............ | G01R 31/318335 703/14 |
| 7,840,865 B2 * | 11/2010 | Lai ................. | G01R 31/318547 714/728 |
| 8,479,067 B2 * | 7/2013 | Chandra ........ | G01B 31/318536 714/729 |
| 8,832,512 B2 * | 9/2014 | Czysz ............. | G01R 31/31813 714/738 |
| 8,887,018 B2 | 11/2014 | Narayanan et al. | |
| 8,914,695 B2 * | 12/2014 | Gizdarski ...... | G01B 31/318547 377/72 |
| 2010/0318863 A1 | 12/2010 | Whetsel | |

(Continued)

*Primary Examiner* — James C Kerveros
(74) *Attorney, Agent, or Firm* — Andrews Kurth Kenyon LLP

(57) ABSTRACT

Systems and methods disclosed herein provide for generating extra variables for an ATPG system utilizing compressed test patterns in the event an ATPG process is presented with faults requiring a higher number of care-bits than can be supported efficiently by the current hardware. The systems and methods provide for a multi-stage decompressor network system with an embedded serializer-deserializer. The systems and methods use a XOR decompressor in a first stage and a serializer-deserializer in conjunction with a second XOR decompressor in a second stage.

18 Claims, 4 Drawing Sheets

(56) References Cited

U.S. PATENT DOCUMENTS

| | | |
|---|---|---|
| 2010/0318866 A1 | 12/2010 | Whetsel |
| 2012/0096324 A1 | 4/2012 | Whetsel |
| 2012/0324305 A1 | 12/2012 | Whetsel |
| 2015/0234009 A1 | 8/2015 | Whetsel |
| 2015/0276871 A1* | 10/2015 | Ren ............... G01R 31/318552 714/727 |
| 2016/0169971 A1 | 6/2016 | Oomman et al. |

* cited by examiner

METHOD AND SYSTEM FOR IMPROVING EFFICIENCY OF XOR-BASED TEST COMPRESSION USING AN EMBEDDED SERIALIZER-DESERIALIZER

TECHNICAL FIELD

The present application relates to systems and methods for generating test patterns to be used in testing integrated circuit designs.

CROSS-REFERENCE TO RELATED APPLICATIONS

This application is related to U.S. patent application Ser. No. 14/754,386, entitled "Method and System for Improving Efficiency of Sequential Test Compression Using Overscan," U.S. patent application Ser. No. 14/737,331, entitled "Elastic Compression—Optimizing Tester Bandwidth with Compressed Test Stimuli Using Overscan and Variable Serialization," and U.S. patent application Ser. No. 14/754,403, entitled "Method for Construction of a Highly Efficient and Predictable Sequential Test Decompression Logic".

BACKGROUND

Automatic test pattern generation ("ATPG") was developed to explicitly test each gate and path in an integrated circuit ("IC") design. As ICs have become larger and more complex, the amount of logic to be tested per input/output test pin has increased dramatically, increasing test time and cost.

When an ATPG tool generates a scan test for a fault, or a set of faults, only a small percentage of scan cells in the scan channel need to take specific values (e.g., care bits). The rest of the cells in the scan channel are "don't care", and are usually filled with random values. Relatively few bits in an ATPG generated test pattern are "care" bits.

Test Compression takes advantage of the small number of significant values (care bits) to reduce test data and test time. However, as Test Compression decreases channel lengths, the number of specified bits (e.g., care bits) per time slice increases. An ATPG process for a certain test pattern may specify certain bits (e.g., care bits) across multiple time slices of the test pattern in order to reduce toggling, and, therefore, power consumption. There can be a large variance in the number of care bits across time slices.

For a spreader network of a plurality of XOR logic gates (e.g., XOR decompressor), the maximum number of care bits that can be solved for each scan cycle is limited by the total number of scan inputs. Therefore, XOR decompressors cannot solve for slices that have more care bits than the available scan data (e.g., input variables). Further, XOR decompressors are also limited in that they are restricted to using only the scan data available in the same scan cycle.

Accordingly, there is a need for generating "extra" variables in the event the ATPG is presented with faults that require a much higher number of care-bits than can be supported efficiently by the current hardware (e.g., XOR decompressors).

DESCRIPTION OF EMBODIMENTS

The following description of embodiments provides non-limiting representative examples referencing numerals to particularly describe features and teachings of the invention. The embodiments described should be recognized as capable of implementation separately, or in combination, with other embodiments from the description of the embodiments. A person of skill in the art reviewing the description of embodiments should be able to learn and understand the different described aspects of the invention. The description of embodiments should facilitate understanding of the invention to such an extent that other implementations of the invention, not specifically covered but within the knowledge of a person of skill in the art having read the description of embodiments, would be understood to be consistent with an application of the invention.

One aspect of the present disclosure is to provide systems and methods for generating "extra" variables during the ATPG process in the event the ATPG is presented with faults that require a much higher number of care-bits than can be supported efficiently by the current test decompression hardware. The methods and apparatuses herein address at least one of the ATPG problems described above. Accordingly, a multi-stage decompressor network system with a serializer-deserializer ("SerDes") is provided.

According to an embodiment, an automatic test pattern generation system includes: a controller, configured to receive m scan inputs from a tester, and providing a first control signal; an i-bit serializer-deserializer; a decompressor network, configured to receive the m scan inputs from the tester, the decompressor network comprising first and second parts, the first part of the decompressor network including a first spreading network of XOR logic gates configured to receive the m scan inputs from the tester and output $2^{m-1}$ outputs, the second part of the decompressor network including a broadcast network configured to receive each of the m scan inputs from the tester and output each of the m scan inputs to the corresponding i-bit serializer-deserializer, wherein i is an integer greater than 1; a second spreading network of XOR logic gates receiving an output of the i-bit serializer-deserializer; and a multiplexer stage including at least one multiplexer, the at least one multiplexer having a first multiplexer input configured to receive at least one of the outputs of the first spreading network, a second multiplexer input configured to receive an output from the second spreading network, and a third multiplexer input configured to receive the first control signal, wherein, based on the first control signal, the multiplexer selects one of the first and second multiplexer inputs to output to a plurality of scan channels.

Aspects of the invention include a method performing the functions as just described.

Figure 1:
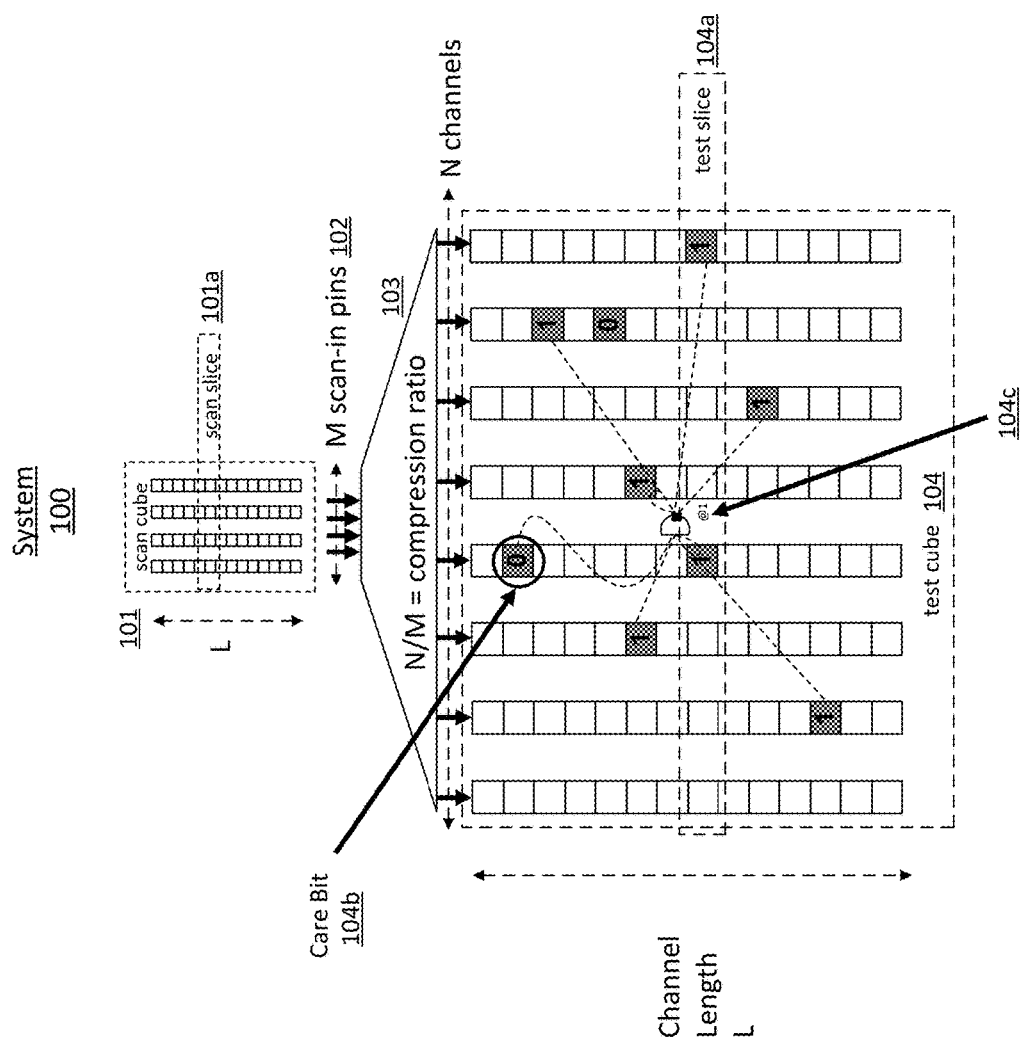
FIG. 1 illustrates the elements of a test decompressor network system utilized during automatic test pattern generation.

FIG. 1 illustrates elements of a system 100 utilized during ATPG. System 100, utilizing scan cube 101 (which includes one of many scan slices 101a), includes scan-in pins 102, decompressor 103, producing test cube 104 (which includes a test slice 104a among a plurality of test slices, as well as care bits 104b, and an indication 104c of a faulty AND gate). In an embodiment, scan cube 101 is the generated test pattern that will be applied to a circuit design in order to identify potential defects. Accordingly, in an embodiment, scan slice 101a will be applied to flip-flops associated with the location of scan slice 101a during the test of the digital circuit. In an embodiment, during the automatic test pattern generation process, care bits 104b are placed throughout the test slices 104 of the scan channels of test cube 104 in order to test for faults. For example, in order to properly detect fault 104c, care bit 104b (as well as other care bits indicated by a binary value of either 1 or 0) are required to be placed in specified locations in the scan channels as illustrated in FIG. 1. In an embodiment, the fault to be tested for in the digital circuit is an AND gate 104c which is stuck-at 1 (e.g., an individual pin is stuck at a logical '1'). Further, as depicted in FIG. 1, the compression ratio of decompressor 103 refers to the ratio of the number of the channels N to the number of the scan-in pins M.

In an embodiment, each scan cycle with care bits is solved one at a time from the earliest scan cycle with care bits (e.g., closer to the bottom of the test cube 104) to the last scan cycle with care bits (e.g., closer to the bottom of the decompressor 103), so that the ATPG process focuses on solving just the scan cycle of interest. Specifically, the equation solver solves for the variables (e.g., scan-in pin 102 inputs) necessary to generate the desired care bits (e.g., 104b) at each scan slice of the scan channels. Each channel input of the scan slice generally corresponds to a different Boolean combination (e.g., due to the decompressor 103) of the input bit variables (e.g., scan-in pin 102 inputs). Accordingly, each scan slice corresponds to a plurality of linear equations (e.g., ax=b). With the Boolean combinations provided by the decompressor 103 (e.g., the "a") and the corresponding care bit values (e.g., the "b") for each of the scan channels of the scan cycle, the equation solver can solve for the desired scan input variables (e.g., the "x"). After the equation solver determines the desired scan input variables, the variables are extracted to a corresponding location in the scan pattern.

Figure 2:
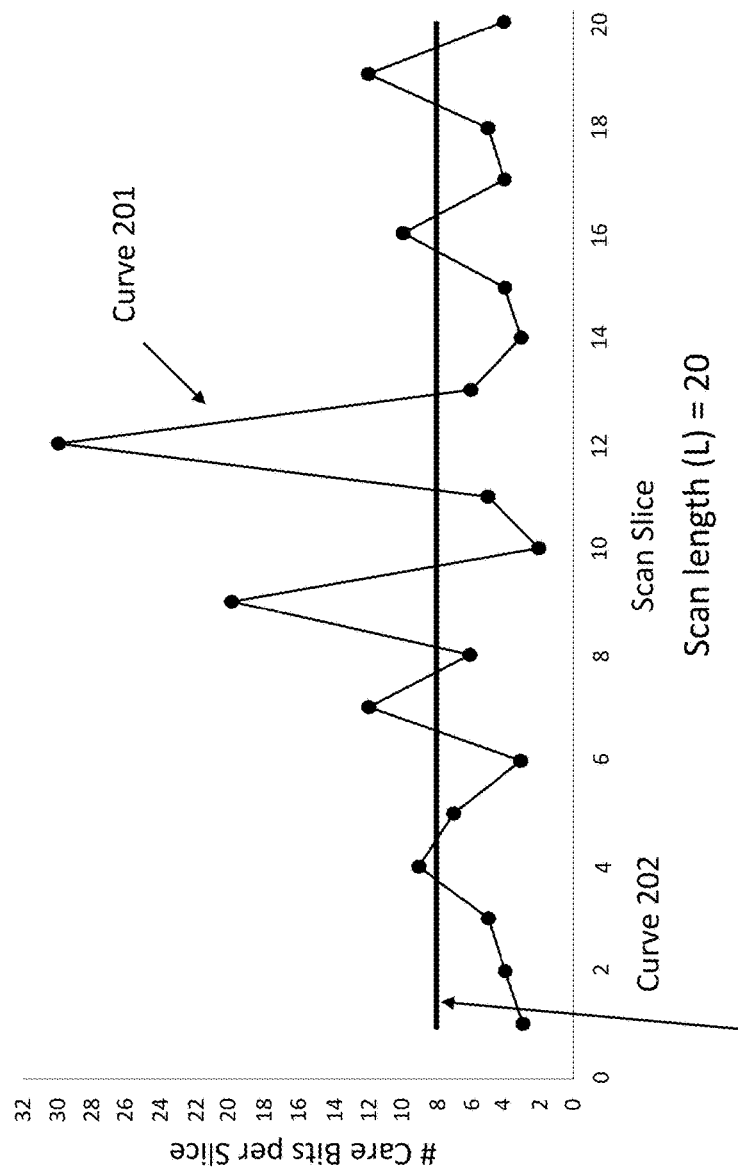
FIG. 2 is a graph depicting the total number of care bits that can be solved for, per scan slice, with a standard XOR decompressor.

FIG. 2 is a graph depicting the total number of care bits that can be solved for, per scan slice, with a standard XOR decompressor. For example, assuming 8 scan-in inputs, the XOR decompressor would shift in 8 variables every scan cycle (see curve 202). Accordingly, the equation solver can solve a maximum of 8 care bits per scan slice (e.g., 3 care bits or less is usually guaranteed). Thus, as depicted in FIG. 2, many scan slices with care bits exceeding 8 will not be solved (see curve 201). Specifically, with the XOR decompressor, many of the 154 care bits in the test pattern will not be solved. Further, as depicted in FIG. 2, the test data volume (e.g., the product of the number of scan-in inputs M and the scan length L) of the compressed test pattern stored on the tester is 160 bits (e.g., area under curve 202).

Figure 3:
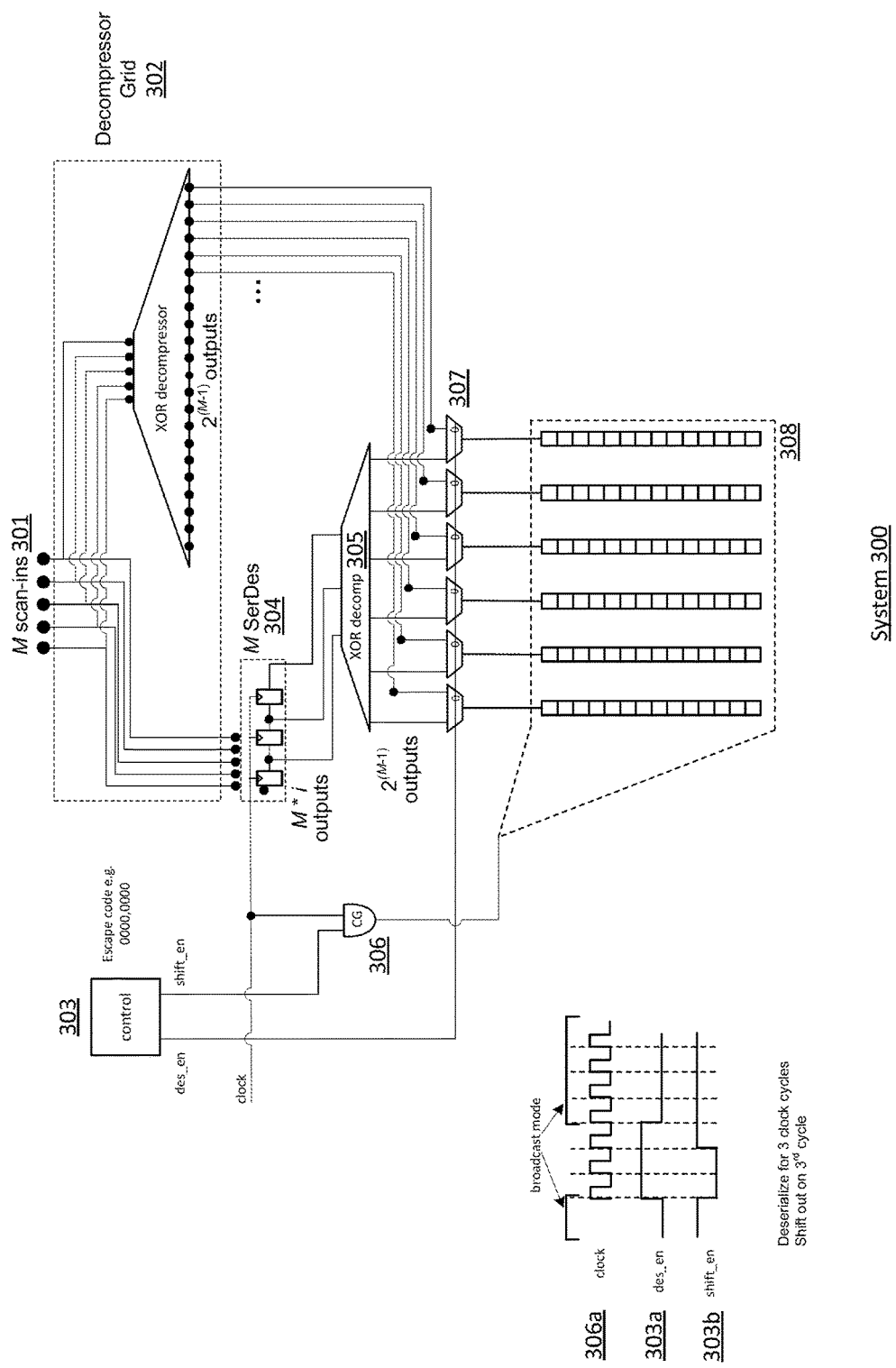
FIG. 3 illustrates the elements of a multi-stage decompressor network system including a serializer-deserializer.

FIG. 3 illustrates the elements of a multi-stage decompressor network system including a serializer-deserializer. In an embodiment, system 300 includes M scan-in pins 301 (e.g., to receive inputs from the tester), decompressor network 302, controller 303, SerDes 304, XOR decompressor 305 (e.g., a spreading network of XOR logic gates), clock gate 306, multiplexer stage 307 and scan channels 308. In an embodiment, decompressor network 302 includes an XOR decompressor (e.g., a spreading network of XOR logic gates). In an embodiment, the traditional decompressor outputs $2^{(M-1)}$ decompressed outputs from the M scan-in inputs. In another embodiment, decompressor network 302 also includes a broadcast mode, in which the decompressor network 302 directly connects each of the M scan-in inputs to a corresponding i-bit (e.g., 2 or 3-bit) SerDes 304. In an embodiment, the output of the i-bit SerDes 304 feeds an XOR decompressor 305. In an embodiment, a multiplexer ("MUX") stage 307 allows the scan channels 308 to be fed by either the XOR decompressor of decompressor network 302 (e.g., the first stage) or XOR decompressor 305 (e.g., the second stage). In an embodiment, a multiplexer of MUX stage 307 receives at a first input, the output of the XOR decompressor of decompressor network 302 and, at a second input, the output of the XOR decompressor 305. Specifically, depending on a signal input (e.g., signal 303a of controller 303) on a third input of the multiplexer (e.g., the select line), the scan channels 308 are fed by either the XOR decompressor of decompressor network 302 or XOR decompressor 305. For example, if the ATPG process runs into a group of linear of equations for a certain scan slice that cannot be solved (e.g., because of correlation of certain channels), the ATPG process would switch to the second stage of the system (e.g., SerDes 304 w/ XOR decompressor 305) to directly load the channels. Otherwise, the ATPG process would normally operate with the first stage of the system (e.g., the XOR decompressor of decompressor network 302). In an embodiment, the ATPG process would utilize the second stage of the system after the equation solver initially solves for all of the other solvable scan slices of the scan channels 308. In an embodiment, the ATPG process determines if a system of equations is unsolvable for a certain scan slice. In an embodiment, after (i) the equation solver solves for all of the solvable scan slices and (ii) it is determined by the equation solver that certain scan slices are unsolvable, the tester (not shown) transmits a signal (e.g., 0000, 0000) to controller 303 to initiate the second stage of the system. In an embodiment, in response to the signal to initiate the second stage of the system, the controller 303 transmits (i) signal 303a to the MUX stage 307 and (ii) signal 303b to clock gate 306 (e.g., clock gate connected to the clocks of all of the flip-flops in the scan chains 308). If signal 303a is high, the MUX stage 307 will only allow the scan channels 308 to be fed by XOR decompressor 305. In an embodiment, when the scan channels 308 are only fed by XOR decompressor 305 (e.g., the second stage), the equation solver is provided with more variables (e.g., the product of the number of scan-in inputs and the value of i for the i-bit SerDes) to utilize in the system of equations for the particular scan slice. On the other hand, if signal 303a is low, MUX stage 307 will only allow the scan channels 308 to be fed by the XOR decompressor of decompressor network 302 (e.g., the first stage). In an embodiment, if signal 303b is high, scan channels 308 will continue to shift down values. Otherwise, if signal 303b is low, the clocks to scan channels 308 will freeze and, thus, no values will shift down scan channels 308. In an embodiment, the clocks to the flip-flops of the scan chains are frozen in order for the SerDes to initialize each value in the i-bit shift register of the SerDes. In an embodiment, the SerDes can dynamically alter the value of the i for the i-bit shift register depending on the number of care bits required for the particular scan slice. In another embodiment, either the XOR decompressor of decompressor network 302 or the XOR decompressor 305 can include a hierarchical XOR gate structure. In an embodiment, an extractor (not shown) (i) extracts the solution (e.g., the required spread of input variables to detect the desired care bits) after the system of equations corresponding to the certain scan slice is solved and (ii) transmits the solution to a corresponding scan cycle location in a test pattern stored in a database. In an embodiment, during the second stage, once the system of equations corresponding to the certain scan slice is solved, the appropriate variables (e.g., the required spread of input variables to detect the desired care bits) are parsed out and extracted to a corresponding scan cycle location in a test pattern stored in a database.

Figure 4:
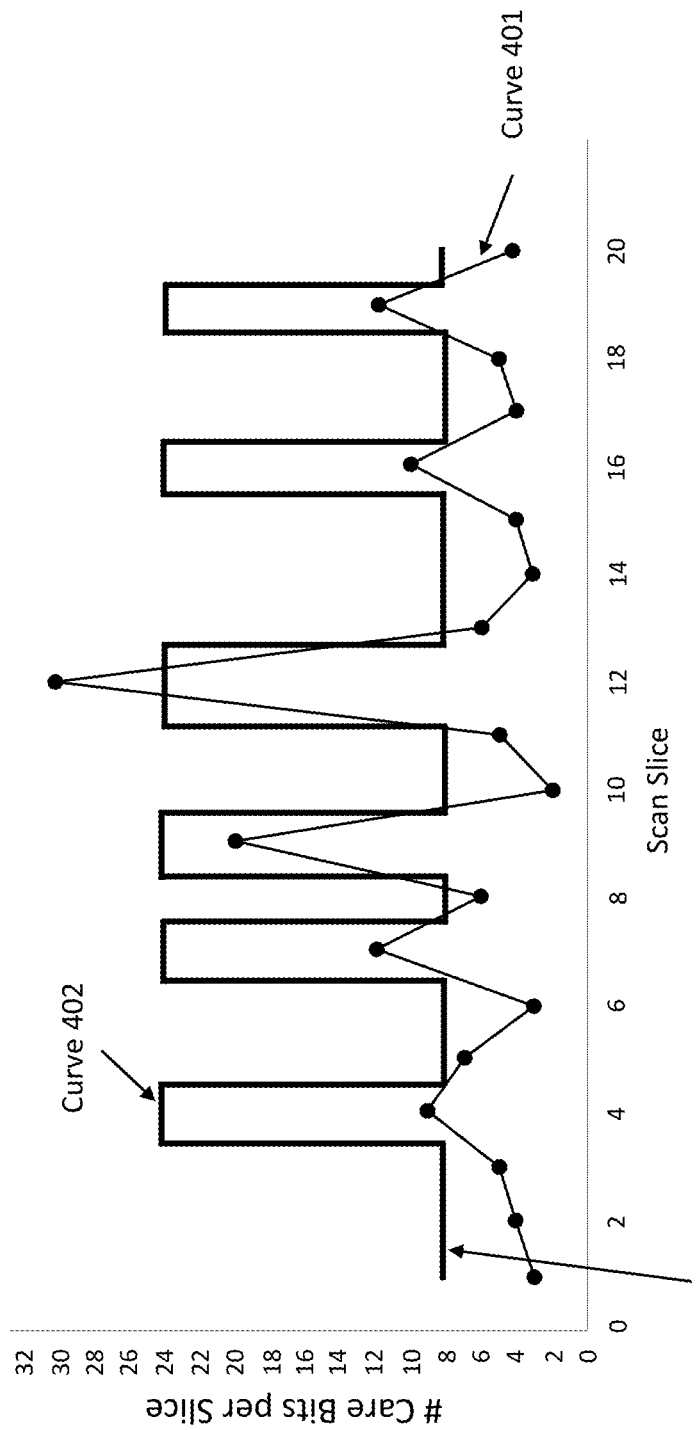
FIG. 4 is a graph depicting the total number of care bits that can be solved for, per scan slice, with the multi-stage decompressor network system including the serializer-deserializer.

FIG. 4 is a graph depicting the total number of care bits that can be solved for, per scan slice, with a multi-stage decompressor network system including the SerDes. For example, assuming 8 scan-in inputs and a SerDes width of 3 (or a 3-bit SerDes), the combination of a XOR decompressor and the SerDes would shift in 24 bits per scan slice (e.g., the product of number of scan-in inputs and the SerDes width). Accordingly, the equation solver can now solve up to 24 care bits per scan slice. Thus, as depicted in FIG. 4, many of the 154 care bits in the test pattern will now be solved (see curve 401). Further, as depicted in FIG. 4, the data volume (e.g., area under curve 402) of the XOR decompressor and the SerDes is 254 bits (e.g., (8×14)+24×6).

The description of the foregoing embodiments may refer to algorithms, sequences, macros, and operations that require processor execution of instructions stored in memory. The processor may be specific to an apparatus, such as automated test equipment (ATE). The processing device executes, or selectively activates in order to execute, a computer program. The computer program is stored in memory associated with the apparatus. Memory available on the apparatus may include a computer readable storage medium, which is not limited to, but may include, any type of disk, including floppy disks, optical disks, CD-ROMs, magnetic-optical disks, and other memory such as read-only memory (ROMs), random access memory (RAMs), electrically erasable programmable read-only memory (EEPROM), flash memory, and yet other storage such as magnetic or optical cards, or any type of media that stores program instructions. Each of the memory devices implemented in the apparatus is further connected to or coupled to a system bus or a network connection, wired or unwired, capable of facilitating or driving communications.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of the Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. An automatic test pattern generation system, comprising: a controller, configured to receive m scan inputs from a tester, and provide a first control signal;
an i-bit serializer-deserializer;
a decompressor network, configured to receive the m scan inputs from the tester, the decompressor network comprising first and second parts, the first part of the decompressor network including a first spreading network of XOR logic gates configured to receive the m scan inputs from the tester and output $2^{m-1}$ outputs, the second part of the decompressor network including a broadcast network configured to receive each of the m scan inputs from the tester and output each of the m scan inputs to the corresponding i-bit serializer-deserializer, wherein i is an integer greater than 1;
a second spreading network of XOR logic gates receiving an output of the i-bit serializer-deserializer; and
a multiplexer stage including at least one multiplexer, the at least one multiplexer having a first multiplexer input configured to receive at least one of the outputs of the first spreading network, a second multiplexer input configured to receive an output from the second spreading network, and a third multiplexer input configured to receive the first control signal,
wherein, based on the first control signal, the multiplexer selects one of the first and second multiplexer inputs to output to a plurality of scan channels.

2. The automatic test pattern generation system of claim 1, further comprising:
an equation solver configured to solve linear equations for at least one bit in at least one scan cycle of the plurality of scan channels, wherein the linear equations correspond to a plurality of Boolean combinations on at least one of the m scan inputs as a result of one of the first spreading network and the second spreading network.

3. The automatic test pattern generation system of claim 2, further comprising:
an extractor configured to (i) extract a solution for the linear equations for the at least one bit in the at least one scan cycle of the plurality of scan channels and (ii) transmit the extracted solution to a corresponding scan cycle location in a test pattern stored in a database.

4. The automatic test pattern generation system of claim 1, wherein the controller outputs a second control signal, the system further comprising:
a clock gate, configured to receive the second control signal at a first input and a clock signal at a second input, and provide a clock output signal to enable or disable a shift into the plurality of scan channels.

5. The automatic test pattern generation system of claim 1, wherein i of the i-bit serializer-deserializer varies depending on linear equations for at least one bit in at least one scan cycle of the plurality of scan channels.

6. The automatic test pattern generation system of claim 1, wherein at least one of the first spreading network and the second spreading network is hierarchical.

7. A computer-implemented method of generating test patterns, comprising:
receiving, at a first spreading network of XOR logic gates, a plurality of scan inputs from a tester;
feeding, with outputs of the first spreading network, a plurality of scan channels;
solving, with an equation solver, linear equations for at least one bit in at least one scan cycle of the plurality of scan channels, wherein the linear equations corresponds to a plurality of Boolean combinations on at least one of the scan inputs as result of the first spreading network;
extracting, with an extractor, a solution for the linear equations for the at least one bit in the at least one scan cycle of the plurality of scan channels and transmitting the extracted solution to a corresponding scan cycle location in a test pattern stored in a database;

upon determining, with the equation solver, that another set of linear equations for at least one other bit in at least one other scan cycle of the plurality of scan channels cannot be solved, (i) disabling a feed from the first spreading network to the plurality of scan channels and (ii) enabling a feed from a second spreading network to the plurality of scan channels, wherein the second spreading network is configured to receive outputs from an i-bit serializer-deserializer configured to receive an input from the plurality of scan inputs;

solving, with the equation solver, the other set of linear equations for at least the one other bit in the at least one other scan cycle of the plurality of scan channels, wherein the other set of linear equations corresponds to a plurality of Boolean combinations on at least one of the scan inputs as result of the second spreading network.

8. The computer-implemented method of claim 7, further comprising:

extracting, with the extractor, a solution for the other set of linear equations for the at least one other bit in the at least one other scan cycle of the plurality of scan channels and transmitting the extracted solution, for the other set of linear equations, to a corresponding scan cycle location in the test pattern stored in the database.

9. The computer-implemented method of claim 7, wherein, after the feed from the first spreading network to the plurality of scan channels is disabled, access to the plurality of scan channels is disabled for a period of i−1 clock cycles until i shift registers of the i-bit serializer-deserializer are updated.

10. The computer-implemented method of claim 9, wherein, after the i shift registers of the i-bit serializer-deserializer are updated, the plurality of scan channels are fed by the second spreading network.

11. The computer-implemented method of claim 7, wherein i of the i-bit serializer-deserializer varies depending on the other set of linear equations for the at least one other bit in the at least one other scan cycle of the plurality of scan channels.

12. The computer-implemented method of claim 7, wherein, upon determining that the other set of linear equations for the at least one other bit in the at least one other scan cycle of the plurality of scan channels cannot be solved, solving, with the equation solver, at least a second other set of linear equations for at least a second other bit in at least a second other scan cycle of the plurality of scan channels, wherein the at least second other set of linear equations corresponds to a plurality of Boolean combinations on at least one of the scan inputs as result of the first network.

13. A non-transitory computer readable medium containing program instructions for generating test patterns, wherein execution of the program instructions by one or more processors of a computer system causes one or more processors to perform the following:

receiving, at a first spreading network of XOR logic gates, a plurality of scan inputs from a tester;

feeding, with outputs of the first spreading network, a plurality of scan channels;

solving, with an equation solver, linear equations for at least one bit in at least one scan cycle of the plurality of scan channels, wherein the linear equations correspond to a plurality of Boolean combinations on at least one of the scan inputs as result of the first spreading network;

extracting, with an extractor, a solution for the linear equations for the at least one bit in the at least one scan cycle of the plurality of scan channels and transmitting the extracted solution to a corresponding scan cycle location in a test pattern stored in a database;

upon determining, with the equation solver, that another set of linear equations for at least one other bit in at least one other scan cycle of the plurality of scan channels cannot be solved, (i) disabling a feed from the first spreading network to the plurality of scan channels and (ii) enabling a feed from a second spreading network to the plurality of scan channels, wherein the second spreading network is configured to receive outputs from an i-bit serializer-deserializer configured to receive an input from the plurality of scan inputs;

solving, with the equation solver, the other set of linear equations for at least the one other bit in the at least one other scan cycle of the plurality of scan channels, wherein the other set of linear equations corresponds to a plurality of Boolean combinations on at least one of the scan inputs as result of the second spreading network.

14. The non-transitory computer readable medium of claim 13, wherein execution of the program instructions by one or more processors of a computer system further causes one or more processors to perform the following:

extracting, with the extractor, a solution for the other set of linear equations for the at least one other bit in the at least one other scan cycle of the plurality of scan channels and transmitting the extracted solution, for the other set of linear equations, to a corresponding scan cycle location in the test pattern stored in the database.

15. The non-transitory computer readable medium of claim 13, wherein, after the feed from the first spreading network to the plurality of scan channels is disabled, access to the plurality of scan channels is disabled for a period of i−1 clock cycles until i shift registers of the i-bit serializer-deserializer are updated.

16. The non-transitory computer readable medium of claim 15, wherein, after the i shift registers of the i-bit serializer-deserializer are updated, the plurality of scan channels are fed by the second spreading network.

17. The non-transitory computer readable medium of claim 13, wherein i of the i-bit serializer-deserializer varies depending on the other set of linear equations for the at least one other bit in the at least one other scan cycle of the plurality of scan channels.

18. The non-transitory computer readable medium of claim 13, wherein, upon determining that the other set of linear equations for the at least one other bit in the at least one other scan cycle of the plurality of scan channels cannot be solved, solving, with the equation solver, at least a second other set of linear equations for at least a second other bit in at least a second other scan cycle of the plurality of scan channels, wherein the at least second other set of linear equations corresponds to a plurality of Boolean combinations on at least one of the scan inputs as result of the first network.

* * * * *